United States Patent [19]
Kobayashi

[11] Patent Number: 4,851,674
[45] Date of Patent: Jul. 25, 1989

[54] ELECTRON BEAM CONTROL APPARATUS FOR USE IN TRANSMISSION ELECTRON MICROSCOPE

[75] Inventor: Hiroyuki Kobayashi, Mito, Japan

[73] Assignee: Hitachi, Ltd., Tokyo, Japan

[21] Appl. No.: 151,962

[22] Filed: Feb. 3, 1988

[30] Foreign Application Priority Data

Feb. 6, 1987 [JP] Japan .................................. 62-24474

[51] Int. Cl.⁴ ............................................. H01J 37/26
[52] U.S. Cl. .................................... 250/311; 250/307; 250/396 R
[58] Field of Search ............... 250/306, 307, 310, 311, 250/396 R, 397, 398

[56] References Cited

U.S. PATENT DOCUMENTS 4,162,403 7/1979 Baumgarten ................. 250/396 ML
4,451,737 5/1984 Isakozawa ........................... 250/311
4,608,491 8/1986 Kokubo ............................... 250/311
4,724,319 2/1988 Shirota ................................ 250/307

Primary Examiner—Jack I. Berman
Attorney, Agent, or Firm—Antonelli, Terry & Wands

[57] ABSTRACT

An electron control beam apparatus. Previously stored in a memory are amounts of electron beam deflection and astigmatism correction for each of several electron beam probe diameters that may be selected. In accordance with the selected electron beam probe diameter adjustment is made of electron beam deflection due to the axis variation, etc. in a projection lens system and correction of astigmatism. Thus, even if the electron beam probe diameter is changed, the electron beam probe is projected on an unvaried or fixed position on a sample, thereby preventing the electron beam probe from slipping away or moving on an observation screen.

10 Claims, 1 Drawing Sheet

ELECTRON BEAM CONTROL APPARATUS FOR USE IN TRANSMISSION ELECTRON MICROSCOPE

BACKGROUND OF THE INVENTION

This invention relates to an electron beam control apparatus for use in a transmission electron microscope, and more particularly to an electron beam control apparatus for use in a transmission electron microscope that can project an electron beam probe onto an unvaried or fixed position on a sample so that the electron beam probe is prevented from slipping away, or moving, on an observation screen when the diameter of the electron beam probe is changed. The diameter of the electron beam probe may be changed for the purpose of selecting the brightness of an electron microscope or selecting the region for X-ray analysis.

Generally, electron microscopes require the electron optical condition to be optimized for each of the observation modes e.g. a high magnification mode, a low magnification mode, a bright/dark visual field mode, an ultra-high dispersion diffraction mode that means the state where a camera length is enlarged to a length of 10 m to 100 m using an imaging system. To this end, prior art electron microscopes individually control the current to be supplied to astigmatism correction means and electron beam deflection means for each of the observation modes by storing the current level for each mode (see U.S. Pat. No. 4,451,737). However, the prior art electron microscope allowes, for the same observation mode, the slipping-away or fluctuation of the electron beam probe on the observation screen due to the change in excitation current in the projection lens system. This is because the astigmatism correction means and the electron beam diffraction means are not controlled for each of the diameters of the electron beam probes used. The prior art does not take into consideration the slipping-away or fluctuation of the electron beam probe.

Thus, the prior art has an inconvenience: when the diameter of the electron beam probe to be projected to a sample is changed by varying the amount of excitation in the projection lens system, the electron beam probe moves or fluctuates on the sample due to very minute axis variations in the projection lens system, and thus the electron beam probe is projected on a different position on the sample from before.

The prior art has an additional inconvenience: since an imaging lens system has enlarged the electron beam transmitted through the sample, the movement of the projected electron beam probe is correspondingly increased, and thus the resulting image or visual field slips from the fluorescent plate and so can not be observed. Whenever this occurs, an operator must undertake the troublesome operation of readjusting the electron beam deflection device and the astigmatism correction device.

SUMMARY OF THE INVENTION

An object of this invention is to provide an electron beam control apparatus suited to a transmission electron microscope which can control the microscope to project an electron beam probe onto an unvaried or fixed position on a sample even when the diameter of the electron beam probe is changed.

The above object of this invention can be attained by arranging the electron beam deflection device and the astigmatism correction device in individual systems for each of the electron beam probe diameters. More specifically, one example of attaining this object is to store previously and individually the amounts of electron beam deflection and of astigmatism correction in a memory (e.g. storage device, variable resistor, etc.) for each electron beam probe diameter (i.e., excitation current in the electron lens in a projection system).

In operation, when the electron beam probe diameter is changed to a selected desired probe diameter, the amount of electron beam deflection and astigmatism correction previously stored correspondingly to the latter probe diameter are retrieved from the memory and the values thereof are output. If the adjustment of electron beam deflection and the correction of astigmatism have been made correspondingly to the probe diameter after change, the values corresponding thereto have been previously stored in the memory so that when the probe diameter is changed, the suitable values corresponding to the probe diameter after change are retrieved and used. Thus, it is not necessary to readjust the electron beam deflection device and/or the astigmatism correction device so that the electron beam does not slip away or move on the screen.

BRIEF DESCRIPTION OF THE DRAWING

The single figure (FIG. 1) is a block diagram showing the arrangement according to one embodiment of this invention.

DESCRIPTION OF THE PREFERRED EMBODIMENT

Figure 1:
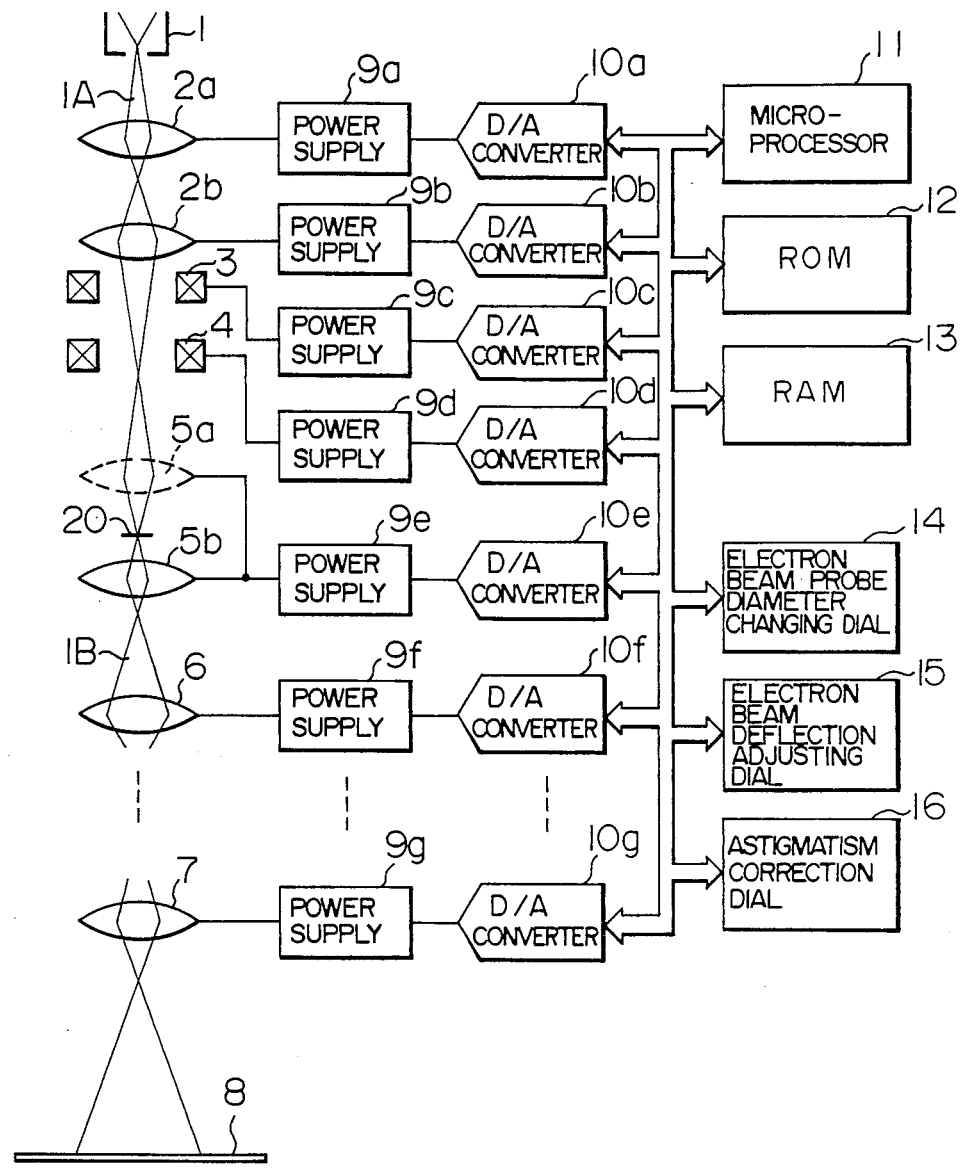

Referring to the drawing, an electron beam 1A emitted from an electron gun 1 is converged through a projection lens system consisting of lenses 2a and 2b, and an objective front magnetic field lens 5a and projected onto the surface of a sample 20. The electron beam 1B transmitted through the sample 20 is magnified through an imaging lens system consisting of an objective rear magnetic field lens 5b and imaging lenses 6 and 7 and imaged or focused on a fluorescent plate 8.

The currents (excitation amounts) in the respective lenses as well as in an astigmatism correction device 3 for correcting the astigmatism generated in the projection lens system and an electron beam deflection device 4 for adjusting the electron beam deflection due to the axis variation in the projection lens system are controlled by a microprocessor 11 through D/A converters 10a to 10g and power supplies 9a to 9g corresponding thereto.

In the drawing, 12 is a memory (ROM) for storing a control program and data (values of excitation currents) of the lenses in the projection lens system which are changed using as parameters the probe diameters. 13 is a memory (ROM) for storing the data (excitation currents) of the electron beam deflection device 4 and the astigmatism correction device 3, which is preferably backed up by a battery.

14 is an electron beam probe diameter changing dial; 15 is an electron beam deflecting amount adjusting dial; and 16 is an astigmatism correction dial.

In the arrangement mentioned above, when such a signal as changing the probe diameter is input from the dial 14, the microprocessor 11 searches or retrieves from the memory 12 the data on the lenses 2a and 2b in the projection lens system which correspond to the new probe diameter and sends the data to the D/A converters 10a and 10b. Also, the microprocessor 11 retrieves from the memory 13 the amounts of electron beam deflection and astigmatism correction which correspond to the new probe diameter and sends the data of the amounts to the D/A converters 10c and 10d.

As mentioned above, since the values (excitation currents) stored in the memories 12 and 13 are properly adjusted for a desired electron beam diameter, in the normal state the desired probe diameter, i.e. the diameter selected by the dial 14, is to be obtained through the above operation.

However, in the cases where secular change, environmental change, etc. in the data have been produced, or the data for the selected probe data are not yet stored, the data on the lenses 2a and 2b, the astigmatism correction device 3 and the electron beam deflection device 4, obtained through the above operation, are not proper. Therefore, the desired electron beam probe diameter can not be obtained through the above operation as it is.

In the case where the data retrieved from the memories 12 and 13 are not proper, an operator makes an adjustment so that the data are proper using the electron beam deflection amount adjusting dial 15 and/or the astigmatism correction dial 16; the adjustment is made observing the brightness or size of the imaging or visual field on the fluorescent plate 8.

More specifically, the microprocessor 11 reads therein the amounts of electron beam deflection or astigmatism set by the dials 15 and 16, takes sums of the read-in amount of electron beam deflection or astigmatism correction and the values (e.g. retrieved values) that are presently sent to the D/A converters 10c and 10d and thereafter send the sum values to the D/A converters 10c and 10d. Also the sum values are stored on the memory 13.

Thus, when the operator has adjusted the electron beam probe to its desired position and shape through the adjustment of the dials 15 and 16, the amounts of electron beam deflection and astigmatism correction are stored in the memory 13 using as a parameter the probe diameter at this time.

If such a processing (adjustment of the probe diameter and storage of the data) is once performed for all the probe diameters to be selected, the electron beam probe does not move even when the probe diameter is changed by the dial 14.

In the embodiment mentioned above, the probe diameter is changed stepwise. On the other hand, in the case where the probe diameter is continuously changed, probe movement can be prevented by obtaining the amounts of electron beam deflection and astigmatism correction for any optional probe diameter through the interpolation operation of the stored values as the respective steps and sending the data to the corresponding D/A converters.

It is also possible to preset the amounts of electron beam deflection and astigmatism correction for the respective probe diameter through corresponding variable resistors or the like. Further, with the resistance, voltage, current, movable contact position, etc. adjusted for each electron beam probe diameter stored in a variable resistor common to several amounts of electron beam deflection and astigmatism correction, these values can be reproduced by suitable means (e.g. servo mechanism) in accordance with the selected probe diameter.

In accordance with this invention, even when the diameter of an electron beam probe to be projected on a sample is changed, the electron beam probe does not move on an observation screen since the electron beam probe is always projected on an unvaried or fixed position on the sample. Thus, this invention has an advantage of greatly improving the operability of an electron microscope.

I claim:

1. An electron beam control apparatus for use in a transmission electron microscope, said apparatus comprising:

an electron gun for emitting an electron beam;

a projection lens system for converging and projecting the electron beam onto a sample, said projection lens system being responsive to a projection excitation amount;

an imaging lens system for imaging the electron beam transmitted through the sample on a fluorescent plate;

at least one of an astigmatism correction device and an electron beam deflection correction device, located between said electron gun and said imaging lens system, said at least one of said devices being responsive to a correction excitation amount;

means for selecting a projection excitation amount for application to said projection lens system to control the diameter of the electron beam;

means for storing values of correction excitation amounts corresponding with each of a plurality of projection excitation amounts;

means for reading out a stored correction excitation amount corresponding with a selected projection excitation amount; and means for energizing said at least one of said devices in accordance with the read out correction excitation amount.

2. An electron beam control apparatus for use in a transmission electron microscope according to claim 1, wherein said means for storing the values of correction excitation amounts is a memory device.

3. An electron beam control apparatus for use in a transmission electron microscope according to claim 1, wherein said means for storing the values of correction excitation amounts is a variable resistor.

4. An electron beam control apparatus for use in a transmission electron microscope according to claim 1, wherein said means for storing the values of correction excitation amounts is means for storing correction values corresponding with stepwise values of projection excitation amounts.

5. An electron beam control apparatus for use in a transmission electron microscope according to claim 2, wherein said means for storing the values of correction excitation amounts is means for storing correction values corresponding with stepwise values of projection excitation amounts.

6. An electron beam control apparatus for use in a transmission electron microscope according to claim 3, wherein said means for storing the values of correction excitation amounts is means for storing correction values corresponding with stepwise values of projection excitation amounts.

7. An electron beam control apparatus for use in a transmission electron microscope according to claim 4, further comprising means for determining values of correction excitation amounts corresponding with projection excitation amounts between the stepwise values through an interpolation operation.

8. An electron beam control apparatus for use in a transmission electron microscope according to claim 5, further comprising means for determining values of correction excitation amounts corresponding with projection excitation amounts between the stepwise values through an interpolation operation.

9. An electron beam control apparatus for use in a transmission electron microscope according to claim 6, further comprising means for determining values of correction excitation amounts corresponding with projection excitation amounts between the stepwise values through an interpolation operation.

10. An electron beam control apparatus for use in a transmission electron microscope according to claim 1, wherein said projection lens system includes a plurality of lenses, at least one of said lenses being responsive to a projection excitation amount.

* * * * *